(12) United States Patent
Notte, IV et al.

(10) Patent No.: US 8,227,753 B2
(45) Date of Patent: Jul. 24, 2012

(54) MULTIPLE CURRENT CHARGED PARTICLE METHODS

(75) Inventors: John A. Notte, IV, Gloucester, MA (US); Billy W. Ward, Merrimac, MA (US)

(73) Assignee: Carl Zeiss NTS, LLC, Peabody, MA (US)

( * ) Notice: Subject to any disclaimer, the term of this patent is extended or adjusted under 35 U.S.C. 154(b) by 319 days.

(21) Appl. No.: 12/493,702

(22) Filed: Jun. 29, 2009

(65) Prior Publication Data

US 2010/0012837 A1 Jan. 21, 2010

Related U.S. Application Data

(60) Provisional application No. 61/080,736, filed on Jul. 15, 2008.

(51) Int. Cl.
*G01N 23/00* (2006.01)
*H01J 37/256* (2006.01)
*H01J 37/28* (2006.01)
*H01J 37/317* (2006.01)

(52) U.S. Cl. .................... 250/307; 250/309; 250/492.21
(58) Field of Classification Search .................. 250/309, 250/307, 492.21
See application file for complete search history.

(56) References Cited

U.S. PATENT DOCUMENTS

| | | | |
|---|---|---|---|
| RE33,193 E * | 4/1990 | Yamaguchi et al. | 250/309 |
| 5,028,780 A * | 7/1991 | Kaito et al. | 250/307 |
| 7,084,399 B2 * | 8/2006 | Muto et al. | 250/309 |
| 7,105,843 B1 * | 9/2006 | Pearl | 250/492.22 |
| 2002/0185597 A1 * | 12/2002 | Ikku et al. | 250/309 |
| 2007/0158558 A1 | 7/2007 | Ward et al. | |

OTHER PUBLICATIONS

Livengood et al., "Helium ion microscope invasiveness and imaging study for semiconductor applications," J. Vac. Sci. Technolog., 25(6):2547-2552, (2007).

* cited by examiner

*Primary Examiner* — Jack Berman
(74) *Attorney, Agent, or Firm* — Fish & Richardson P.C.

(57) ABSTRACT

Charged particle beams with different charged particle currents are disclosed. In some embodiments, a method includes exposing a sample to a first ion beam having a first ion current at the sample, and exposing the sample to a second ion beam having a second ion current at the sample, where the first ion current is at least two times greater than the second ion current. In certain embodiments, a method includes creating a first ion beam at a first pressure, exposing a sample to the first ion beam, creating a second ion beam at a second pressure, and exposing the sample to the second ion beam, where the first pressure is at least two times greater than the second pressure.

20 Claims, 3 Drawing Sheets

MULTIPLE CURRENT CHARGED PARTICLE METHODS

CROSS-REFERENCE TO RELATED APPLICATION

This application claims priority under 35 U.S.C. §119(e)(1) to U.S. Provisional Application No. 61/080,736 filed Jul. 15, 2008. The contents of this application is hereby incorporated by reference in its entirety.

FIELD

The disclosure generally relates to using charged particle beams with different charged particle currents.

BACKGROUND

A gas field ion source can be used to generate an ion beam. The ion beam can be used to investigate and/or modify a sample.

SUMMARY

The disclosure generally relates to using charged particle beams with different charged particle currents. In embodiments in which the charged particle beam is an ion beam, it is possible to reduce the ion beam current without modifying the settings of the components in the ion optics. This can be advantageous compared, for example, to certain electron beam systems where modifying the electron current involves modifying the settings of one or more components of the electron optics.

In some embodiments, a relatively high charged particle beam current is used to tune (e.g., focus and stigmate) the charged particle beam relative to the sample, and a relatively low charged particle beam current is used to investigate and/or modify the sample. Surprisingly, it has been discovered that exposing a sample to a relatively low charged particle current over a longer period of time can reduce potential sample damage compared with using a relatively high charged particle current over a shorter period of time, even when the dose of charged particles at the sample is about the same for the relatively low and relatively high charged particle currents.

It is believed that, in some instances, such as when a sample is an electrical insulator, using a relatively low charged particle beam current to investigate and/or modify the sample can then reduce the possibility of building an electrostatic field at the sample, which can reduce the possibility of undesirable charging and/or arcing of the sample. It is also believed that, in certain cases, such as when the sample is a crystalline sample, using a relatively low charged particle beam current can reduce the possibility of build up of undesirable species (e.g., species present in the charged particle beam) within the sample.

In some cases, potential sample damage can be reduced by tuning (e.g., focusing and stigmating) a charged particle beam at a location of the sample that is not to be investigated and/or modified, followed by using a charged particle beam with a lower charged particle current to investigate and/or modify a region of the sample of interest. With this approach, the region of the sample that is of interest need not be exposed to the relatively high charged particle beam.

It is believed that, in some instances when a gas field ion source is used to form an ion beam, the tip can be damaged due to collisions of gas atoms with the tip. It is believed that using a relatively low ion current can reduce such damage to the tip because fewer gas atoms collide with the tip.

Often, the optics used to form the charged particle beam include one or more beam-forming apertures. It is believed that, in some cases, charged particles can collide with the beam-forming aperture(s) and damage the beam-forming aperture(s). It is believed that using a relatively low charged particle current can reduce such damage to the beam-forming aperture(s) because fewer charged particles interact with the beam-forming aperture(s).

In one aspect, the disclosure features a method that includes exposing a sample to a first ion beam having a first ion current at the sample, and exposing the sample to a second ion beam having a second ion current at the sample. The first ion current is at least two times greater than the second ion current.

In another aspect, the disclosure features a method that includes creating a first ion beam at a first pressure, and exposing a sample to the first ion beam. The method also includes creating a second ion beam at a second pressure, and exposing the sample to the second ion beam. The first pressure is at least two times greater than the second pressure.

In a further aspect, the disclosure features a method that includes generating a first ion beam with an ion source, and using ion optics to focus the first ion beam at a sample. The first ion beam has a first current at the sample. The method also includes generating a second beam with the ion source, and directing the second ion beam to the sample to generate particles. The second ion beam has a second current at the sample. The method further includes detecting the particles to determine information about the sample.

In an additional aspect, the disclosure features a method that includes generating a first ion beam with an ion source, and using ion optics to focus the first ion beam at a sample using a first group of settings for the ion optics. The method also includes generating a second beam with the ion source, and directing the second ion beam to the sample to generate particles using a second group of settings for the ion optics. The first and second groups of settings for the ion optics are substantially the same.

Other features and advantages will be apparent from the description, drawings, and claims.

DETAILED DESCRIPTION

Introduction

Figure 1:
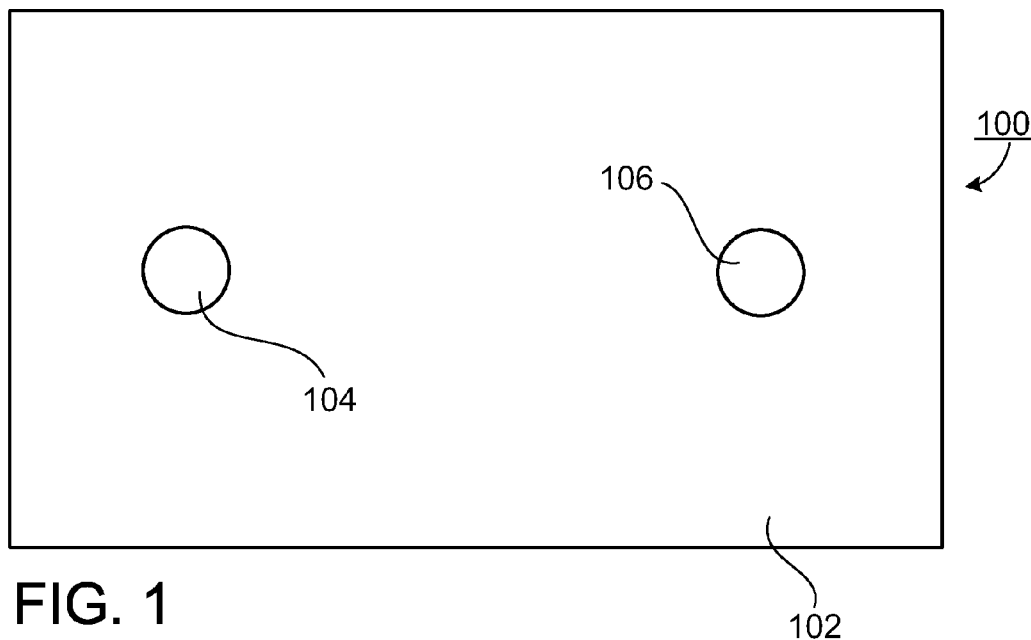
FIG. 1 is a top view of a sample.
Figure 2A:
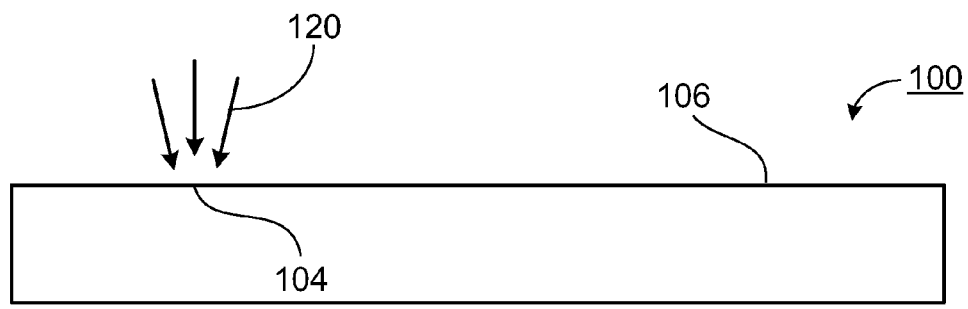
FIG. 2A is a schematic representation of an ion beam interacting with a first region of a sample.
Figure 2B:
FIG. 2B is a schematic representation of an ion beam interacting with a second region of a sample.

FIG. 1 is a top view of a sample 100 that has a surface 102 with a first region 104 and a second region 106. FIGS. 2A and 2B depicts steps in a process of exposing sample 100 to an ion beam to investigate and/or modify sample 100, where the ion beam is formed by a gas field ion source. In FIG. 2A, an ion beam 120 impinges on first region 104, and in FIG. 2B an ion beam 125 impinges on second region 106.

Generally, the distance between regions 104 and 106 can vary as desired. Optionally, the distance between regions 104 and 106 is large enough so that they do not interact with each other, but not so large that a stage motion is required to access both regions. In some embodiments, the distance between regions 104 and 106 can vary anywhere from being on the order of nanometers to on the order of millimeters. In certain embodiments, the distance between regions 104 and 106 is at least 0.2 micron (e.g., 0.5 micron, one micron), and/or at most 20 microns (e.g., at most 10 microns, at most five microns).

In general, ion beam 120 has a relatively high ion current at region 104 and is formed with a relatively high gas background pressure, and ion beam 125 has a relatively low ion current at region 106 and is formed with a relatively low gas background pressure. As an example, ion beam 120 can be used when tuning (e.g., focusing and stigmating) the ion beam on sample 100, and ion beam 125 can be used when investigating and/or modifying sample 100.

In some embodiments, ion beam 120 has an ion current at region 104 that is at least 0.25 pA (e.g., at least 0.5 pA, at least 1 pA, at least 2 pA, at least 3 pA, at least 4 pA, at least 5 pA, at least 6 pA, at least 7 pA, at least 8 pA, at least 9 pA, at least 10 pA). In certain embodiments, ion beam 120 has an ion current at region 104 that is from 1 pA to 10 pA (e.g., from 1 pA to 5 pA).

In some embodiments, ion beam 125 has an ion current at region 106 that is at most 100 fA (e.g., at most 50 fA, at most 25 fA, at most 10 fA, at most 5 fA, at most 1 fA, at most 0.1 fA). In certain embodiments, ion beam 125 has an ion current at region 106 that is from 1 fA to 100 fA (e.g., from 10 fA to 100 fA, from 25 fA to 100 fA).

In some embodiments, the ion current of ion beam 120 at region 104 is at least two times (e.g., at least five times, at least 10 times, at least 25 times, at least 50 times, at least 75 times, at least 100 times, 250 times, 500 times) the ion current of ion beam 125 at region 106.

Gas Field Ion Microscope

Figure 3:
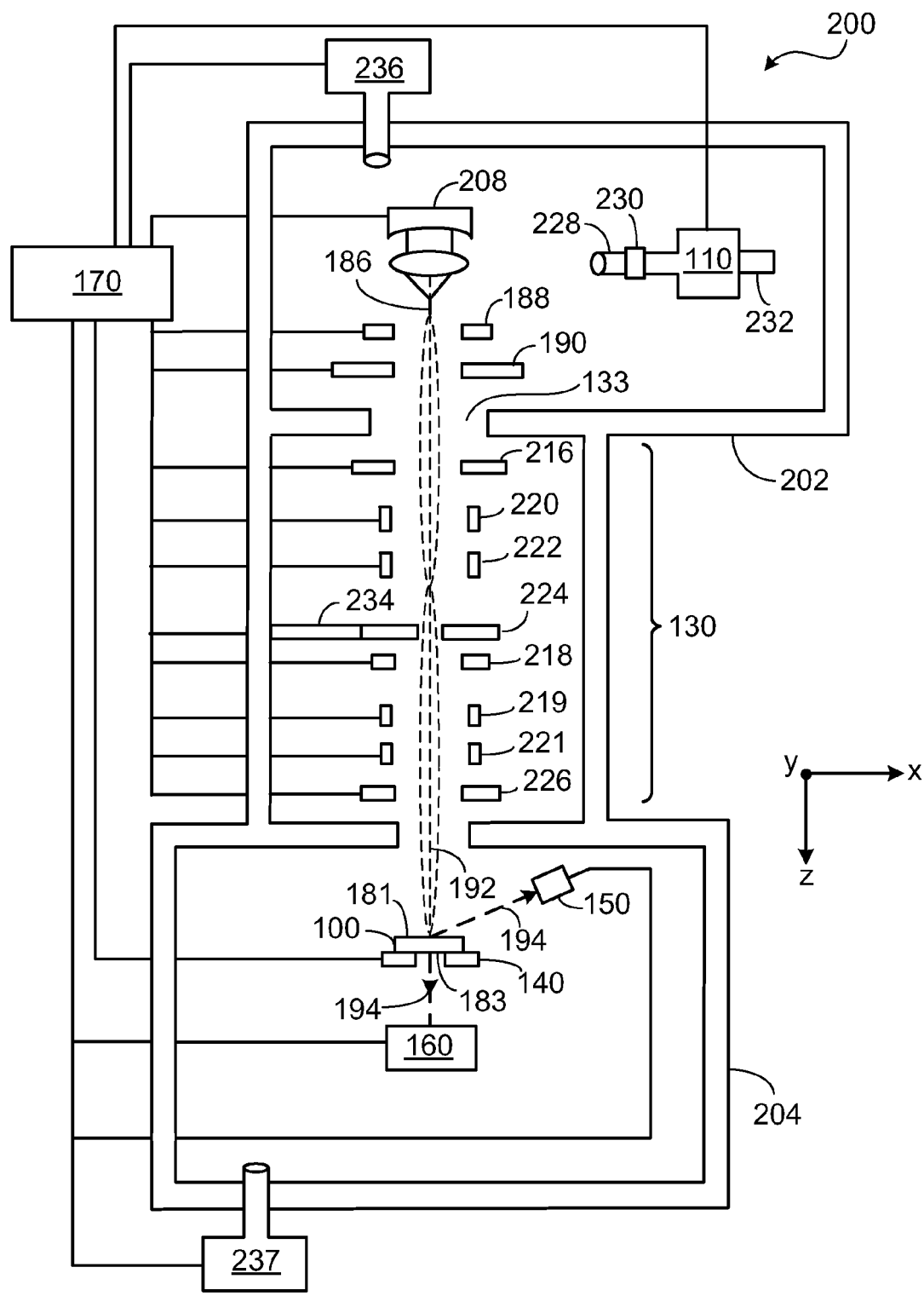
FIG. 3 is a schematic representation of a gas field ion microscope.

In some embodiments, ion beams 120 and 125 are generated using a gas field ion source. FIG. 3 shows a schematic diagram of an exemplary gas field ion microscope system 200. Microscope system 200 includes a first vacuum housing 202 enclosing an ion source and ion optics 130, and a second vacuum housing 204 enclosing sample 100 and detectors 150 and 160. Gas source 110 delivers a gas (e.g., a gas including He, Ne, Ar, Kr or Xe) to microscope system 200 through a delivery tube 228. A flow regulator 230 controls the flow rate of the gas through delivery tube 228, and a temperature controller 232 controls the temperature of the gas in gas source 110. The ion source includes a tip 186 affixed to a tip manipulator 208. The ion source also includes an extractor 190 and optionally a suppressor 188 that are configured to direct ions of a gas from tip 186 into ion optics 130. Ion optics 130 include a first lens 216, alignment deflectors 220 and 222, an aperture 224, an astigmatism corrector 218, scanning deflectors 219 and 221, and a second lens 226. Aperture 224 is positioned in an aperture mount 234. Sample 100 is mounted in/on a sample manipulator 140 within second vacuum housing 204. Detectors 150 and 160, also positioned within second vacuum housing 204, are configured to detect particles 194 from sample 100. Gas source 110, tip manipulator 208, extractor 190, suppressor 188, first lens 216, alignment deflectors 220 and 222, aperture mount 234, astigmatism corrector 218, scanning deflectors 219 and 221, sample manipulator 140, and/or detectors 150 and/or 160 are typically controlled by electronic control system 170. Optionally, electronic control system 170 also controls vacuum pumps 236 and 237, which are configured to provide reduced-pressure environments inside vacuum housings 202 and 204, and within ion optics 130.

Typically during use, the gas is introduced into housing 202, and a relatively high positive potential is applied to tip 186. Ions of the gas are produced and directed to ion optics 130 via extractor 190 and suppressor 188. The components of ion optics 130 direct the beam to sample 100. In general, ion optics 130 are used to tune (e.g., focus and stigmate) the beam, and subsequently used to control the beam during investigation and/or modification of sample 100.

In some embodiments, the settings for the components of ion optics 130 are substantially the same when generating ion beams 120 and 125. As an example, in certain embodiments, the setting of first lens 216 when generating ion beam 125 varies by no more than 10% (e.g., by no more than 5%, by no more than 1%) from the setting of first lens 216 when generating ion beam 120. As another example, in certain embodiments, the setting of alignment deflector 220 when generating ion beam 125 varies by no more than 10% (e.g., by no more than 5%, by no more than 1%) from the setting of alignment deflector 220 when generating ion beam 120. As a further example, in certain embodiments, the setting of alignment deflector 222 when generating ion beam 125 varies by no more than 10% (e.g., by no more than 5%, by no more than 1%) from the setting of alignment deflector 222 when generating ion beam 120. As an additional example, in certain embodiments, the setting of stigmatism corrector 218 when generating ion beam 125 varies by no more than 10% (e.g., by no more than 5%, by no more than 1%) from the setting of stigmatism corrector 218 when generating ion beam 120. As another example, in certain embodiments, the setting of scanning deflector 219 when generating ion beam 125 varies by no more than 10% (e.g., by no more than 5%, by no more than 1%) from the setting of scanning deflector 219 when generating ion beam 120. As a further example, in certain embodiments, the setting of scanning deflector 221 when generating ion beam 125 varies by no more than 10% (e.g., by no more than 5%, by no more than 1%) from the setting of scanning deflector 221 when generating ion beam 120.

In certain embodiments, when generating ion beam 120 the gas pressure in housing 202 is at least about $1 \times 10^{-8}$ Torr (e.g., at least about $1 \times 10^{-7}$ Torr, at least about $1 \times 10^{-6}$ Torr), and/or at most about $1 \times 10^{-4}$ Torr (e.g., at most about $1 \times 10^{-5}$ Torr).

In some embodiments, when generating ion beam 125 gas pressure in housing 202 is at most about $1 \times 10^{-5}$ Torr (e.g., at most $1 \times 10^{-6}$ Torr), and/or at least about $5 \times 10^{-9}$ Torr (e.g., at least about $5 \times 10^{-8}$ Torr, at least about $1 \times 10^{-8}$ Torr).

In some embodiments, the pressure in housing 202 when generating ion beam 120 is at least two times (e.g., at least five times, at least 10 times, at least 25 times, at least 50 times, at least 75 times, at least 100 times, 250 times, 500 times) the pressure in housing 202 when generating ion beam 125.

Exemplary gas field ion microscopes are disclosed in, for example, US 2007-0158558, which is hereby incorporated by reference.

Samples

In general, sample 100 can be any sample of interest.

In some embodiments, sample 100 is a semiconductor article. Semiconductor fabrication typically involves the preparation of an article (a semiconductor article) that includes multiple layers of materials sequentially deposited and processed to form an integrated electronic circuit, an integrated circuit element, and/or a different microelectronic device. Such articles typically contain various features (e.g., circuit lines formed of electrically conductive material, wells filled with electrically non-conductive material, regions formed of electrically semiconductive material) that are precisely positioned with respect to each other (e.g., generally on the scale of within a few nanometers). The location, size (length, width, depth), composition (chemical composition) and related properties (conductivity, crystalline orientation, magnetic properties) of a given feature can have an important impact on the performance of the article. For example, in certain instances, if one or more of these parameters is outside an appropriate range, the article may be rejected because it cannot function as desired. As a result, it is generally desirable to have very good control over each step during semiconductor fabrication, and it would be advantageous to have a tool that could monitor the fabrication of a semiconductor article at various steps in the fabrication process to investigate the location, size, composition and related properties of one or more features at various stages of the semiconductor fabrication process. As used herein, the term semiconductor article refers to an integrated electronic circuit, an integrated circuit element, a microelectronic device or an article formed during the process of fabricating an integrated electronic circuit, an integrated circuit element, a microelectronic device. In some embodiments, a semiconductor article can be a portion of a flat panel display, a photovoltaic cell, or a micromechanical structure.

Other samples may also be used. Examples include biological samples (e.g., tissue, nucleic acids, proteins, carbohydrates, lipids and cell membranes), pharmaceutical samples (e.g., a small molecule drug), frozen water (e.g., ice), read/write heads used in magnetic storage devices, and metal and alloy samples.

Exemplary samples are disclosed in, for example, US 2007-0158558.

Sample Investigation

As noted above, in general, interaction of the ion beam with the sample generates particles 194 that leave sample 100 and can be detected by detectors 140 and/or 150. Exemplary particles include secondary electrons, Auger electrons, secondary ions, secondary neutral particles, primary neutral particles, scattered ions and photons. The detected particles are used to determine information about sample 100, such as, for example, topography information, material constituent information, crystalline information, voltage contrast information, optical property information and magnetic information.

Certain aspects of particle detection are described below.

(i) Secondary Electrons

Detecting the total abundance of secondary electrons can provide information regarding the topography of a sample. The secondary electron total abundance at a given location on a surface generally depends upon the slope of the surface relative to the ion beam at that point. In general, the secondary electron total abundance is higher where the slope of the surface relative to the ion beam is higher (i.e., where the angle of incidence of the ion beam as measured from the surface normal is larger). Thus, the change in the total abundance of secondary electrons as a function of the location of the ion beam on the surface of the sample, can be correlated to a change in the slope of the surface, providing information regarding the topography of the surface of the sample.

Detecting the total abundance of secondary electrons can also yield material constituent information (e.g., elemental information, chemical environment information) about a sample. In such embodiments, the information is predominantly related to the surface of the sample. In general, each element or material in a given chemical environment will have a particular inherent secondary electron yield. As a result, the secondary electron total abundance at a given location on a surface generally depends on the material present at that location. Therefore, the change in the total abundance of secondary electrons as a function of the location of the ion beam on the surface of the sample, can be correlated to a change in the element(s) and/or material(s) present at the surface of the sample, providing material constituent information about the surface of the sample.

(ii) Scattered Ion Abundance

The total abundance of scattered ions can be used to determine qualitative material constituent information because, in general, the scattering probability of an ion, such as a He ion, (and therefore the total abundance of scattered ions, assuming no effects from other factors, such as topographical changes in the surface sample) is approximately proportional to the square of the atomic number (Z value) of the surface atom from which the ion scatters. Thus, as an example, when using He ions and trying to distinguish a copper (atomic number 29) line from silicon (atomic number 14) in a semiconductor article, the total abundance of scattered He ions from a copper atom at a surface of the semiconductor article will be approximately four times the total abundance of scattered ions from a silicon atom at the surface of the semiconductor article. As another example, when using He ions trying to distinguish a tungsten (atomic number 74) plug from silicon (atomic number 14) in a semiconductor article, the total abundance of scattered He ions from a tungsten atom at a surface of the semiconductor article will be approximately 25 times the total abundance of scattered ions from a silicon atom at the surface of the semiconductor article. As a further example, when using He ions trying to distinguish gold (atomic number 79) region from silicon (atomic number 14) in a semiconductor article, the total abundance of scattered He ions from a gold atom at a surface of the semiconductor article will be approximately 25 times the total abundance of scattered ions from a silicon atom at the surface of the semiconductor article. As an additional example, when using He ions and trying to distinguish indium (atomic number 49) from silicon (atomic number 14) in a semiconductor article, the total abundance of scattered He ions from a indium atom at a surface of the semiconductor article will be approximately 10 times the total abundance of scattered ions from a silicon atom at the surface of the semiconductor article.

The total abundance of scattered ions can be detected using a single detector (e.g., a hemispherical detector) configured to detect scattered ions leaving the surface of a sample, or multiple detectors (e.g., located at different solid angles with respect to the surface of the sample) configured to detect scattered ions leaving the surface (iii) Energy-Resolved and Angle-Resolved Scattered Ion Detection Energy-resolved and angle-resolved scattered ion detection can be used to determine quantitative material constituent information about the surface of a sample. The detector is designed so that the angle and energy of each detected scattered ion is known for each angle within the acceptance angle of detector. Using He ions as an example, by measuring the energy and scattering angle of the scattered He ion, the mass of the atom at the surface that scatters the scattered He ion can be calculated based on the following relationship:

$$\frac{E_s}{E_i} = 1 - \frac{2M_{He}M_a}{(M_{He} + M_a)^2}(1 - \cos\theta_s)$$

where $E_s$ is the energy of the scattered He ion, $E_i$ is the incident energy of the He ion, $M_{He}$ is the mass of the He ion, $\theta_s$ is the scattering angle, and $M_a$ is the mass of the atom that scatters the He ion.

The detector can, for example, be an energy-resolving phosphor-based detector, an energy-resolving scintillator-based detector, a solid state detector, an energy-resolving electrostatic prism-based detector, an electrostatic prism, an energy-resolving ET detector, or an energy-resolving microchannel. In general, it is desirable for the detector to have a substantial acceptable angle. In some embodiments, the detector is stationary (e.g., an annular detector). In certain embodiments, the detector can sweep through a range of solid angles. Although a system for detecting energy-resolved and angle-resolved scattered ions that includes a single detector has been described above, such a system can contain multiple (e.g., two, three, four, five, six, seven, eight) detectors. Often, the use of multiple detectors is desirable because it can allow for a larger acceptance angle of detected scattered ions.

Sample investigation is described, for example, in US 2007-0158558.

Detectors

In general, particles 194 can be detected using any appropriate detector. Certain exemplary detectors and arrangements of detectors are described below.

(i) Everhart-Thornley Detectors

An Everhart-Thornley (ET) detector can be used to detect secondary electrons, ions, and/or neutral particles. Such detectors are described, for example, in US 2007-0158558. Briefly, an ET detector can include a particle selector, a conversion material, a support, a photon detector, and two voltage sources. The particle selector is typically formed of an electrically conductive material. In some embodiments, for example, the particle selector can be from any open electrode structure that includes a passage for particles to pass through, such as a grid, a mesh, a ring or a tube. Particle selector 601 can be formed from one or more electrodes, and potentials applied to the one or more electrodes can generally be selected as desired according to the type of particles being measured. The conversion material is formed of a material that, upon interaction with a charged particle (e.g., an ion, an electron) can form a photon. Exemplary materials include phosphor materials and/or scintillator materials (e.g., crystalline materials, such as yttrium-aluminum-garnet (YAG) and yttrium-aluminum-phosphate (YAP). The support is usually formed of a material that is relatively transparent to photons formed by conversion material. During operation, a first voltage source applies a voltage of relatively small magnitude (e.g., 500 V or less, such as from 100 V to 500 V) to the particle selector, and a second voltage source applies a voltage of relatively large magnitude (e.g., 5 kV or more, 10 kV or more) to the conversion material. Typically, during electron detection, the sign of the voltage applied to the particle selector and conversion material is positive with respect to the sample. Usually, when detecting ions, the sign of the voltage applied to the particle selector and the conversion material is negative with respect to the sample. In certain embodiments, the sample can also be biased (with respect to the common external ground) to assist in delivering particles from the sample to the detector. Charged particles (e.g., electrons or ions) from the sample are attracted to the particle selector, pass through the particle selector, and are accelerated toward the conversion material. The charged particles then collide with the conversion material, generating photons. The photons pass through the support and are detected by the photon detector.

(ii) Microchannel Plate Detectors

In some embodiments, a microchannel plate detector can be used to amplify a flux of secondary electrons, neutral atoms, or ions from a sample. Microchannel plates are typically formed from materials such as fused silica, and generally include a large number of small diameter channels arranged in the form of an array. Particles enter individual channels and collide with channel walls, generating free electrons. Typically, multiple free electrons are generated on each collision of a particle (neutral atom, ion, or electron) with a channel wall. As a result, a cascaded electron signal corresponding to an amplification of the input particle signal exits the microchannel plate.

Microchannel plate-based detectors (which can include one or more microchannel plates) can be configured to detect ions, secondary electrons, and/or neutral atoms from the sample. Neutral particles and/or ions (e.g., secondary ions and atoms, scattered ions and primary atoms) formed from the sample typically leave the surface of the sample (the surface on which the ion beam impinges).

Microchannel plates amplify an incoming particle signal and convert the incoming signal to an outgoing electron signal. To visualize the outgoing electron signal, microchannel plate-based detectors can also include a conversion material, a screen, and a photon detector (see discussion above).

(iii) Conversion Plates

In some embodiments, a conversion plate can be used to detect ions (e.g., scattered ions, secondary ions) from the sample or neutral particles (e.g., primary neutral He atoms in the case where He ions are the primary constituent of the ion beam) from the sample. Typically, a conversion plate can be formed from a thin foil material that, when struck by an incident ion or atom, has a high secondary electron yield. An example of such a material is platinum.

(iv) Channeltron Detectors

Channeltron detectors can also be used to detect particles such as electrons, ions and neutral atoms leaving the sample. Channeltron detectors function by amplifying particle signals through multiple internal collisions in a manner similar to that described in connection with microchannel plate detectors. Measurement of relatively weak secondary electron, ion, or neutral atom fluxes from the sample is possible by measuring the amplified particle signals that are output by a channeltron detector.

(v) Phosphor Detectors

Phosphor-based detectors, which include a thin layer of a phosphor material deposited atop a transparent substrate, and a photon detector such as a CCD camera, a PMT, or one or more diodes, can be used to detect electrons, ions and/or neutral particles from the sample. Particles strike the phosphor layer, inducing emission of photons from the phosphor which are detected by the photon detector.

(vi) Solid State Detectors

Solid state detectors can be used to detect secondary electrons, ions, and/or neutral atoms from the sample. A solid state detector can be constructed from a sensor formed of a material such as silicon, or a doped silicon material. The number of electron-hole pairs generated by an incident particle, and therefore the corresponding magnitude of the current produced, depends in part upon the particle's energy. Thus, a solid state detector can be particularly useful for energy measurements of particles, which can be especially advantageous when detecting high energy particles (e.g., scattered He ions and neutral He atoms in the case where He ions are the primary constituent of the ion beam) from the sample. An example of a solid state detector is a silicon drift detector.

(vii) Scintillator Detectors

Similar to phosphor-based detectors, scintillator-based detectors include a scintillator material that generates photons in response to being struck by an incident particle (electron, ion, or neutral atom). Suitable scintillator materials include, for example, YAG and YAP. The photon yield in scintillator-based detectors depends on the energy of the incident particles. As a result, a scintillator detector can be particularly useful for energy measurements of particles, which can be especially advantageous when detecting high energy particles (e.g., scattered He ions and neutral He atoms in the case where He ions are the primary constituent of the ion beam) from the sample.

(viii) Energy Detectors for Ions

A variety of different detectors and detection schemes can be implemented to measure energies of ions (e.g., scattered He ions in the case where He ions are the primary constituent of the ion beam) from the sample. Electrostatic prism detectors, in which an electric and/or magnetic field is used to deflect incident ions, where the amount of deflection depends on the energy of the ions, can be used to spatially separate ions with different energies. Magnetic prism detectors may also be used to spatially separate ions based on the energy of the ions. Any of the suitable detectors discussed above (e.g., microchannel plates, channeltrons, and others) can then be used to detect the deflected ions.

Quadrupole detectors can also be used to analyze energies of ions from the sample. In a quadrupole detector, a radio-frequency (RF) field within the quadrupole ensures that ions having a chosen mass and energy propagate along a straight, undeflected trajectory within the quadrupole. Ions with a different mass and/or energy propagate along a curved trajectory within the quadrupole. From the deflected position of ions within the quadrupole analyzer, energies of the ions can be determined.

In some embodiments, ion energy can be determined by placing a positively biased particle selector (e.g., a screen or mesh of electrically conductive material, or a cylindrical metal tube or ring) along the flight path of the ions and in front of the detector. The magnitude of the electrical potential applied to the particle selector can initially be very high (e.g., a value certain to prevent ions from the sample from passing therethrough), and the magnitude of the electrical potential can be reduced while using an appropriate detector (see discussion above) to detect the ions. The current of ions that reach the detector as a function of the magnitude of the potential bias on the particle selector can be used to determine information about the energy of the ions.

(ix) Energy Detectors for Electrons

A variety of different detectors and detection schemes can be implemented to measure energies of electrons (e.g., secondary electrons) from the sample. Prism detectors, in which an electric and/or magnetic field is used to deflect incident electrons, and where the amount of deflection depends on the energy of the electrons, can be used to spatially separate electrons with different energies. Any of the suitable detectors discussed above can then be used to detect the deflected electrons.

In some embodiments, electron energies can be determined by placing a negatively biased particle selector (e.g., a screen or mesh of electrically conductive material, or a cylindrical metal tube or ring) along the flight path of the electrons and in front of the detector. The magnitude of the electrical potential of the particle selector can initially be very high (e.g., a value certain to prevent the electrons from the sample from passing therethrough), and the magnitude of the electrical potential can be reduced while using an appropriate detector (see discussion above) to detect the electrons. The electron current that reaches the detector as a function of the magnitude of the applied electrical potential on the particle selector can be used to determine information about the energies of the electrons.

(x) Angle-Dependent Measurements

Typically, to acquire angle-dependent information, a detector is affixed to a mount (e.g., a swivel mount) that permits movement of the detector throughout a range of solid angles about the sample. At a given orientation with respect to the sample that corresponds to a particular solid angle, abundance and/or energy measurements of particles are recorded. The detector is sequentially re-positioned at different solid angles and the measurements are repeated to determine the angular dependence of the measured quantities. In some embodiments, a limiting aperture such as a pinhole can be placed in front of the detector in the path of the scattered particles to further restrict the range of angles over which measurement of particles from the sample occurs.

Detectors and arrangements of detectors are described, for example, in US 2007-0158558.

Sample Modification

In some embodiments, the systems and methods can be used to modify (e.g., repair) a sample (e.g., to repair a region of the article at or near the portion of the article exposed by the cross-section). Such modification can involve gas assisted chemistry, which can be used to add material to and/or remove material to a sample (e.g., a given layer of the sample). As an example, gas assisted chemistry can be used for semiconductor circuit editing in which damaged or incorrectly fabricated circuits formed in semiconductor articles are repaired. Typically, circuit editing involves adding material to a circuit (e.g., to close a circuit that is open) and/or removing material from a circuit (e.g., to open a circuit that is closed). Gas assisted chemistry can also be used in photolithographic mask repair. Mask defects generally include an excess of mask material in a region of the mask where there should be no material, and/or an absence of mask material where material should be present. Thus, gas assisted chemistry can be used in mask repair to add and/or remove material from a mask as desired. Typically, gas assisted chemistry involves the use of a charged particle beam (e.g., ion beam, electron beam, both) that interacts with an appropriate gas (e.g., $Cl_2$, $O_2$, $I_2$, $XeF_2$, $F_2$, $CF_4$, $H_2O$, $XeF_2$, $F_2$, $CF_4$, $WF_6$). As another example, modification of a sample can involve sputtering. In some instances, when fabricating articles, it can be desirable during certain steps to remove materials (e.g., when removing undesired material from a circuit to edit the circuit, when repairing a mask). An ion beam can be used for this purpose where the ion beam sputters material from the sample. In particular, an ion beam generated via the interaction of gas atoms with a gas field ion source as described herein can be used for sputtering a sample. Although He gas ions may be used, it is typically preferable to use heavier ions (e.g., Ne gas ions, Ar gas ions, Kr gas ions, Xe gas ions) to remove material. During the removal of material, the ion beam is focused on the region of the sample where the material to be removed is located. Examples of such inspection are disclosed, for example, in US 2007-0158558.

Other Embodiments

While certain embodiments have been described, other embodiments are possible.

As an example, while examples have been described in which a gas field ion source is used, other types of ion sources may also be used. In some embodiments, a liquid metal ion source can be used. An example of a liquid metal ion source is a Ga ion source (e.g., a Ga focused ion beam column).

As a further example, while embodiments have been described in which an ion source is used as a charged particle source, more generally, any charged particle source may be used to cause secondary electrons to leave the sample. For example, an electron source, such as a scanning electron microscope may be used.

Figure 4A:
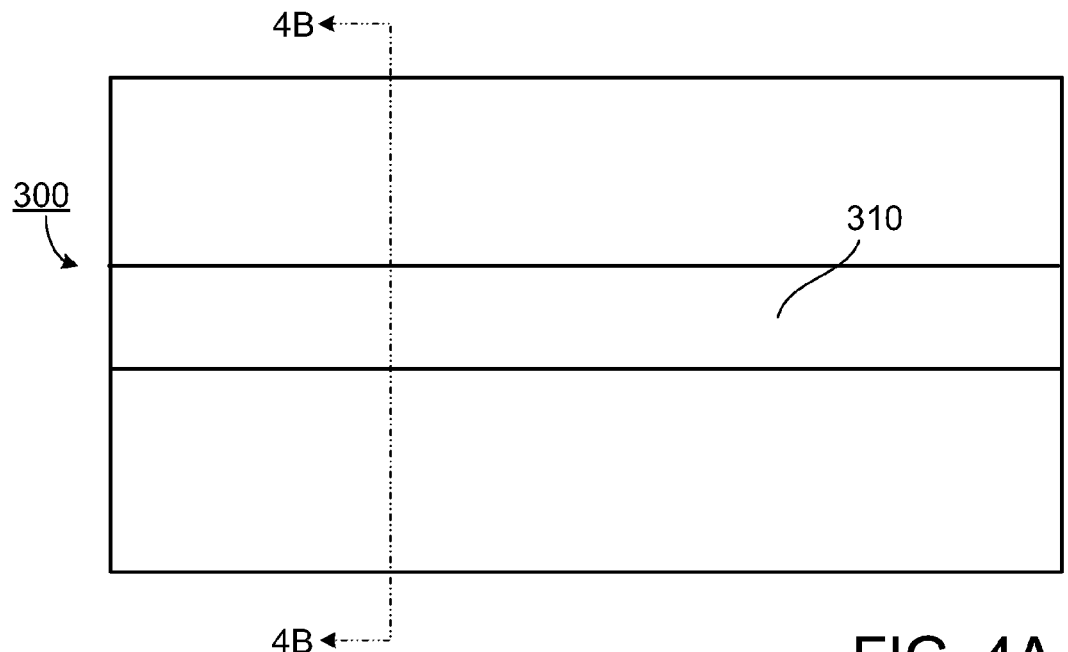
FIGS. 4A and 4B show partial top and cross-sectional views, respectively, of an article having a cut cross-section.
Figure 4B:
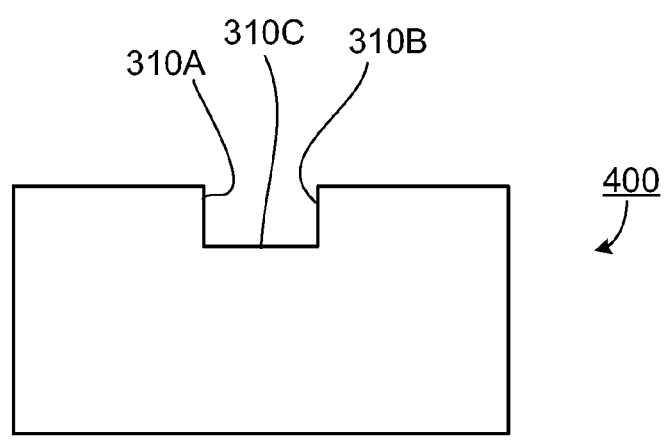

As yet a further example, while embodiments have been described which depict an upper surface of a sample being inspected, other surfaces of a sample may also be inspected. In some embodiments, a cross-section of a sample may be inspected. FIGS. 4A and 4B show partial top and cross-sectional views, respectively of a sample 300. As shown in FIG. 4B, sample 300 has been cut to expose a cross-section 310 with sidewalls 310A and 310B and bottom wall 310C. Although not shown in FIGS. 4A and 4B, in instances where sample 300 is, for example, a semiconductor article, sample 300 will generally include many layers of different materials, and, in some instances, multiple different materials within the same layer. A charged particle beam may be used to inspect and/or modify sidewalls 310A and/or 310B, and or bottom wall 310C.

As an additional example, while embodiments have been described in which two different regions of a sample are exposed to charged particle beams having different charged particle currents at the sample, more generally any desired number of regions can be exposed to charged particle beams of different currents. In certain embodiments, at least 3 (e.g., at least 4, at least 5, at least 6, at least 7, at least 8, at least 9, at least 10) different regions are exposed to charged particle beams having different charged particle currents at the sample. In certain embodiments, the charged particle beam has a different charged particle current at each of the different regions of the sample. In some embodiments, the charged particle beam has the same charged particle current at least some of (e.g., at least 2 of, at least 3 of, at least 4 of, at least 5 of, at least 6 of) the different regions of the sample).

As an another example, while embodiments have been described in which at least two different regions of a sample are exposed to a charged particle beam having different charged particle currents at the sample, in some embodiments, one region of the sample is exposed to a charged particle beam having different charged particle currents. For example, in some embodiments, the same region is exposed to the charged particle during tuning (e.g., focusing and stigmating) and sample investigation and/or modification).

Combinations of embodiments are also possible.
Other embodiments are covered by the claims.

What is claimed is:
1. A method, comprising:
selecting first and second locations of a sample;
using a gas field ion source to generate a first ion beam;
exposing the first location of the sample to the first ion beam;
tuning the first ion beam relative to the sample at the first location of the sample without modifying or investigating the first location of the sample, the first ion beam having a first ion current at the sample;
using the gas field ion source to generate a second ion beam;
exposing the second location of the sample to the second ion beam, the second ion beam having a second ion current at the sample; and
investigating and/or modifying the second location of the sample with the second ion beam,
wherein the first location of the sample is different from the second location of the sample, and the first ion current is at least two times greater than the second ion current.

2. The method of claim 1, wherein tuning the first ion beam relative to the first location of the sample comprises using ion optics to focus and stigmate the first ion beam relative to the first location of the sample.

3. The method of claim 2, wherein the ion optics comprise at least some components selected from the group consisting of electrodes, apertures, deflectors and stigmators.

4. The method of claim 3, wherein a first group of settings of the ion optics are used to generate the first ion beam, a second group of settings of the ion optics are used to generate the second ion beam, and the first and second groups of settings are substantially the same.

5. The method of claim 1, wherein the first ion current is at least five times the second ion current.

6. The method of claim 1, wherein the first ion beam is created at a first pressure, the second ion beam is created at a second pressure, and the first pressure is at least two times the second pressure.

7. The method of claim 1, wherein exposing the second ion beam to the second location of the sample generates a first plurality of particles from the sample, and the method further comprises detecting at least some of the first plurality of particles.

8. The method of claim 7, further comprising determining information about the sample based on the detected particles.

9. The method of claim 7, wherein exposing the first ion beam to the first location of the sample generates a second plurality of particles, and the second plurality of particles are not detected.

10. The method of claim 1, further comprising modifying the sample with the second ion beam.

11. The method of claim 1, wherein there is no interruption between formation of the first and second ion beams.

12. A method, comprising:
selecting first and second locations of a sample;
operating a gas field ion source at a first pressure to create a first ion beam;
exposing the first location of the sample to the first ion beam;
tuning the first ion beam relative to the sample at the first location of the sample without modifying and/or investigating the first location of the sample;
operating the gas field ion source at a second pressure to create a second ion beam;
exposing the second location of the sample to the second ion beam; and
investigating and/or modifying the second location of the sample with the second ion beam,
wherein the first location of the sample is different from the second location of the sample, and the first pressure is at least two times greater than the second pressure.

13. The method of claim 12, wherein exposing the second location of the sample to the second ion beam generates a first plurality of particles from the sample, and the method further comprises detecting at least some of the first plurality of particles.

14. A method, comprising:
selecting first and second regions of a sample;
generating a first ion beam with a gas field ion source;
using ion optics to focus the first ion beam at the first region of a sample using a first group of settings for the ion optics so that the first ion beam has a first current at the sample without modifying and/or investigating the first region of the sample with the first ion beam;
generating a second beam with the gas field ion source;
directing the second ion beam to the second region of the sample to generate particles using a second group of settings for the ion optics so that the second ion beam has a second current at the sample; and
investigating and/or modifying the second region of the sample with the second ion beam, wherein the first and second groups of settings for the ion optics are substantially the same, the first current is at least two times greater than the second current, and the first region of the sample is different from the second region of the sample.

15. The method of claim 12, wherein the first pressure is at least five times the second pressure.

16. The method of claim 14, wherein tuning the first ion beam relative to the first location of the sample comprises using ion optics to focus and stigmate the first ion beam relative to the first location of the sample.

17. The method of claim 16, wherein the ion optics comprise at least some components selected from the group consisting of electrodes, apertures, deflectors and stigmators.

18. The method of claim 17, wherein a first group of settings of the ion optics are used to generate the first ion beam, a second group of settings of the ion optics are used to generate the second ion beam, and the first and second groups of settings are substantially the same.

19. The method of claim 14, wherein the first ion current is at least five times the second ion current.

20. The method of claim 14, wherein exposing the second ion beam to the second location of the sample generates a first plurality of particles from the sample, and the method further comprises detecting at least some of the first plurality of particles.

* * * * *

UNITED STATES PATENT AND TRADEMARK OFFICE
CERTIFICATE OF CORRECTION

| | | |
|---|---|---|
| PATENT NO. | : 8,227,753 B2 | |
| APPLICATION NO. | : 12/493702 | |
| DATED | : July 24, 2012 | |
| INVENTOR(S) | : John A. Notte, IV | |

It is certified that error appears in the above-identified patent and that said Letters Patent is hereby corrected as shown below:

Column 6,
Line 44, Delete "surface" and insert --surface.--

Column 11,
Line 14, Delete "and or" and insert --and/or--

Signed and Sealed this
Second Day of October, 2012

David J. Kappos
*Director of the United States Patent and Trademark Office*